United States Patent [19]
Opitz

[11] Patent Number: 5,160,999
[45] Date of Patent: Nov. 3, 1992

[54] ACCELERATION RESISTANT PACKAGING FOR INTEGRATED CIRCUITS AND METHOD OF PRODUCING THEM

[75] Inventor: Hans-Peter Opitz, Ratingen, Fed. Rep. of Germany

[73] Assignee: Rheinmetall GmbH, Düsseldorf, Fed. Rep. of Germany

[21] Appl. No.: 543,823

[22] PCT Filed: Jul. 12, 1989

[86] PCT No.: PCT/EP89/00806

§ 371 Date: Jul. 9, 1990

§ 102(e) Date: Jul. 9, 1990

[87] PCT Pub. No.: WO90/05379

PCT Pub. Date: May 17, 1990

[30] Foreign Application Priority Data

Nov. 10, 1988 [DE] Fed. Rep. of Germany ....... 3838085

[51] Int. Cl.$^5$ .................... H01L 29/06; H01L 23/20
[52] U.S. Cl. .................... 257/702; 257/227; 257/729
[58] Field of Search ............ 357/70, 80, 74, 72; 361/398, 72

[56] References Cited

U.S. PATENT DOCUMENTS

| | | | |
|---|---|---|---|
| 3,152,288 | 10/1964 | Mittler | 361/398 |
| 3,221,286 | 11/1965 | Fedde | 361/398 |
| 3,376,479 | 4/1968 | Wines et al. | 361/398 |
| 3,716,846 | 2/1973 | Volckart et al. | 361/398 |
| 3,766,439 | 10/1973 | Isaacson | 361/398 |
| 3,772,776 | 11/1973 | Weisenburger | 361/398 |
| 3,971,127 | 7/1976 | Giguere et al. | 361/398 |
| 4,026,011 | 5/1977 | Walton | 361/398 |
| 4,203,127 | 5/1980 | Tegge, Jr. | 357/81 |
| 4,412,272 | 10/1983 | Wedertz et al. | 361/398 |
| 4,504,850 | 3/1985 | Pollard et al. | 357/75 |
| 4,841,355 | 6/1989 | Parks | 357/81 |

FOREIGN PATENT DOCUMENTS 0122687 10/1984 European Pat. Off. .
0277606 8/1988 European Pat. Off. .
61-27633 2/1986 Japan .

OTHER PUBLICATIONS

Patent Abstracts of Japan; Band 10, Nr. 179 (E-414) (2235), 24. Jun. 86; & JP, A, 6127663 (NEC Corp.) 7. Feb. 86.

*Primary Examiner*—Andrew J. James
*Assistant Examiner*—Viet Q. Nguyen
*Attorney, Agent, or Firm*—Spencer, Frank & Schneider

[57] ABSTRACT

An acceleration resistant packaging for integrated circuits. Integrated circuits are usually packaged in plastic or ceramic housings. However, due to the great accelerations that occur, circuits packaged in that manner cannot be employed in projectiles. According to the invention each integrated circuit (5, 6) is arranged and between two thin sheets (1, 2) and the circumference of these sheets is clamped into a clamping frame (3, 4).

19 Claims, 2 Drawing Sheets

5,160,999

ACCELERATION RESISTANT PACKAGING FOR INTEGRATED CIRCUITS AND METHOD OF PRODUCING THEM

BACKGROUND OF THE INVENTION

The invention relates to acceleration resistant packaging for integrated circuits and further relates to a method of producing them.

Normally, integrated circuits are packaged in a plastic or ceramic housing. Depending on the housing type, the terminals are realized in different ways. Customarily bonding wires are brought out from the soldering pads toward the bottom or toward the side. However, circuits packaged in this manner cannot be employed in projectiles. Due to the high accelerations occurring there, microcracks appear in the ceramic housings and, under certain circumstances, the housings are completely destroyed. With plastic housings, bonding wires break off or the plastic material prematurely gasifies so that the required storability does not meet military specifications. Moreover, the prior art packagings frequently require too much space to be used in projectiles.

It has therefore already become known to encapsulate integrated circuits in projectiles or to employ special metal housings.

The encapsulation of circuits, however, has various drawbacks, such as heavy weight, poor testability of the circuit, high temperatures during casting which may cause faults, high expenditures and relatively large structural size, etc.

If metal housings are employed, the resulting structural sizes are also relatively large and costs are high; also, vibration damping is poor.

SUMMARY OF THE INVENTION

It is therefore the object of the present invention to develop an acceleration resistant packaging which has the smallest possible structural size and whose resistance to acceleration is more than 30,000 g. Moreover, vibrations are to be damped and costs justifiable.

This is accomplished according to the invention by an acceleration resistant packaging for integrated circuits wherein: the integrated circuits are each disposed between two thin sheets of a shock resistant, elastic material, wherein connecting leads for the integrated circuits extend beyond the periphery of the thin sheets, and wherein the two thin sheets are fastened together and clamped in a clamping frame along their entire periphery to define a closed interior space containing the integrated circuits.

The basic idea of the invention is thus to employ, for the packaging, not a housing of plastic, ceramic or metal or to encapsulate the circuits, but to arrange the circuits between thin sheets, glue these sheets together and provide them with a clamping frame from which the terminals or connecting leads for the integrated circuit project on the sides.

The thin sheets protect the integrated circuits against environmental influences such as vibrations, radiation and—if the material is selected appropriately—also against temperature fluctuations.

On the basis of the materials employed and their small mass as well as their elasticity, full acceleration resistance is realized in contrast to plastic or ceramic packagings. Moreover, a significant advantage of the packaging according to the invention lies in the great savings in weight and the possibility of accommodating several integrated circuits in one clamping frame.

Greater details and further advantages of the will be described below with reference to embodiments that are illustrated in the drawing figures.

DETAIL DESCRIPTION OF THE PREFERRED EMBODIMENTS

Figure 1:
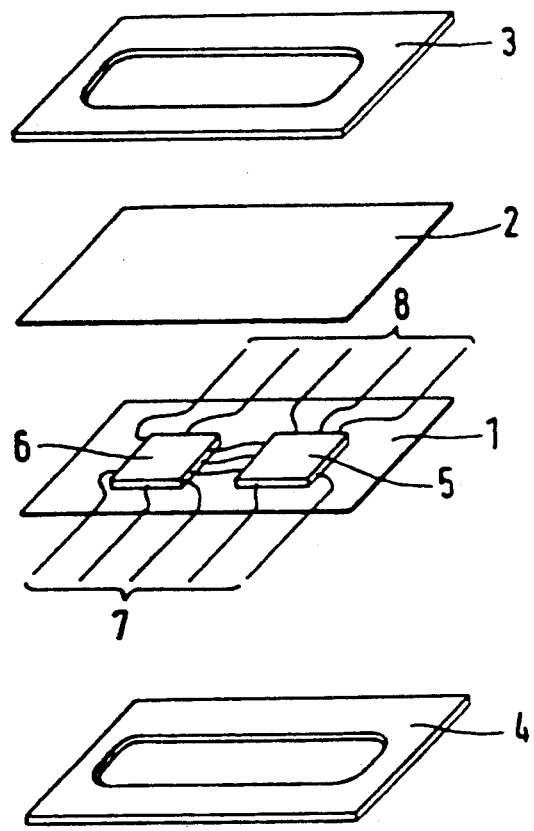
FIG. 1 is a schematic representation in an exploded view of a packaging according to the invention.

In FIG. 1, the reference numeral 1 identifies a first thin sheet, the numeral 2 a second thin sheet and the reference numerals 3 and 4 identify an upper and a lower frame portion.

Two integrated circuits 5 and 6 are disposed on the first thin sheet 1 and are connected with connecting leads or wires 7 and 8.

Figure 2:
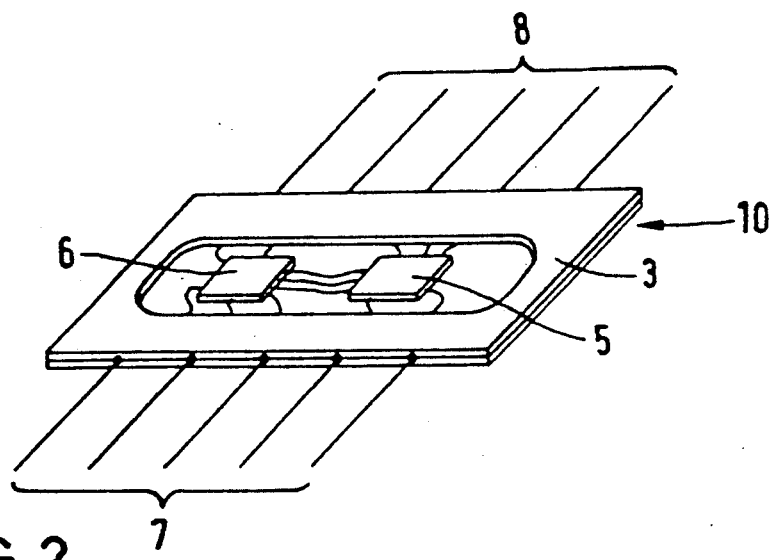
FIG. 2 is a schematic view of the packaging shown in FIG. 1, in the assembled state.

FIG. 2 shows the individual components shown in FIG. 1 in the assembled state. The entire packaging was here given the reference numeral 10.

The method of producing the packaging shown in FIGS. 1 and 2 will now be discussed briefly.

Integrated circuits 5 and 6 are applied to thin sheet 1 and are fastened to the sheet, for example, by means of an adhesive. Externally supplied connecting wires 7 and 8 are fastened to the sheet 1 at both sides, also by gluing. In the next step, all connections are made by bonding to the soldering pads (not shown) of integrated circuits 5 and 6. Thereafter, the second thin sheet 2 is placed onto the first thin sheet 1 including integrated circuits 5 and 6. The thin sheets 1 and 2 may then be glued together at their edges. In the next step, the thin-sheet system is provided with a frame component 3 from the top and with a frame component 4 from the bottom, and the entire frame is glued together. Accessible from the outside are only connecting wires 7 and 8 which establish contact with the integrated circuits 5 and 6 by way of the bonded connections.

Before gluing together thin sheets 1 and 2, it may be advisable to evacuate the interior of the thin sheets or to provide it with an inert gas. This excludes or at least greatly reduces all impurities in the air within the thin sheets, so that the storability of such a structure is increased, since the probability of slow chemical or physical reactions is reduced.

Instead of applying integrated circuits 5 and 6 directly onto thin sheet 1, it has been found to be of advantage to initially apply layers of conductor paths onto thin sheets 1 and 2 and to then arrange the integrated circuits 5 and 6 on these layers. Two different methods are known for the application of the conductor path layers: a thin-film technique and a thick-film technique. In the thin-film technique the conductor paths are fixed on the thin sheet in a known manner by printing and etching, that is, the conductor paths are replaced by glued-on silver conductive paths. In the thick-film technique, insulators or conductor path pastes are initially applied to the thin sheet and, in a last step, are solidified in a firing process (temperature less than 150° C.).

The integrated circuits must then be accommodated on the contacting points of the laminar circuits so that the intended solder pads of the IC's can be connected directly with the contacting points. This can be effected either by soldering a short bonding wire or by the application of a dot of solder, heating and pressing of the thin sheet. The first version is suited for contacting if the conductive layers are accommodated on thin sheet 1 and the integrated circuits are applied so that their planar functional layer is oriented toward thin sheet 2. The second version is suitable for an orientation of the laminar circuit toward the functional layer of the IC.

In connection with the practical manufacture of the packaging, care should be taken that a function test is performed after each manufacturing step so as to avoid rejects.

Figure 3:
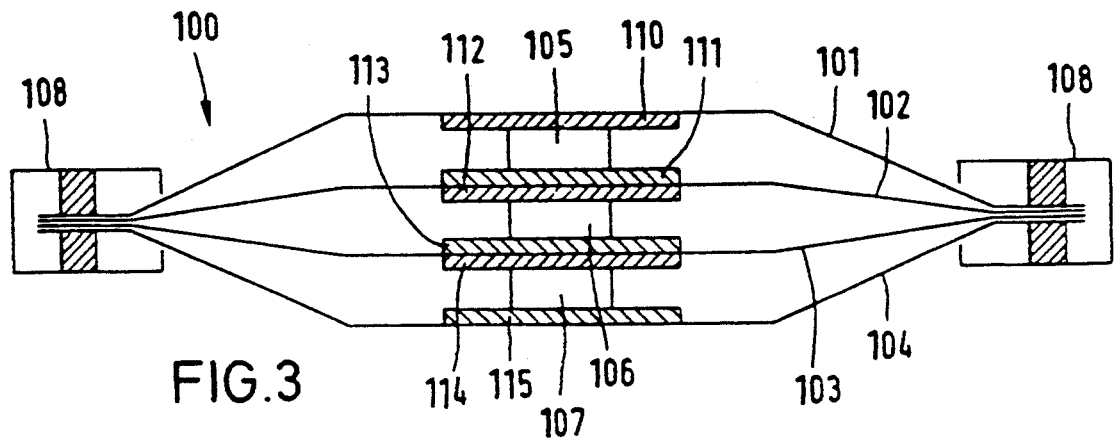
FIG. 3 is a sectional view showing another example of a schematically illustrated packaging according to the invention, with the integrated circuits being arranged in several layers.

In addition to the possibility of employing integrated circuits in one plane, the thin-sheet method according to the invention opens up the way for multi-dimensional chaining of the integrated circuits. In that case, instead of two superposed thin sheets, three or more thin sheets are employed and a layer of integrated circuits is provided in the layers between them. A corresponding embodiment is shown in FIG. 3.

Here the packaging is marked 100, the thin sheets 101 to 104, the only schematically illustrated integrated circuits are marked 105 to 107, the clamping frame is marked 108 and the laminar circuits, which are applied in the thick-film technique and are also shown only schematically, are marked 110 to 115.

Laminar circuits 110 to 115 serve the purpose of interconnecting the integrated circuits. For example, laminar circuit 110 may establish a connection with 111 and 112 by way of the clamped-in thin sheets at frame 108 and, additionally, it covers the necessary soldering pads of IC's 105 to conduct their signals toward the outside or to the other circuits, respectively. In this case, circuit 111 should be connected with circuit 1!2 by way of the thin sheet. Connections 112, 106, 113, and 114, 107 and 115 may be configured in the same way so that all integrated components are in communication with one another by virtue of being clamped in at 108 or by way of laminar circuits 110 to 115.

Advisably, the integrated circuits packaged according to the invention are stored in the respective projectile in such a manner that the maximum force attacks the clamping at an angle of 90°. The entire thin-sheet structure should be installed in such a manner that vibrations of a small displacement are possible, with the thin sheet yielding slightly but that, in the case of great accelerations, a support surface is provided to prevent the sheets from tearing. For this purpose, the clamping frames may be accommodated in the standard housing or they may be employed directly.

Figure 4:
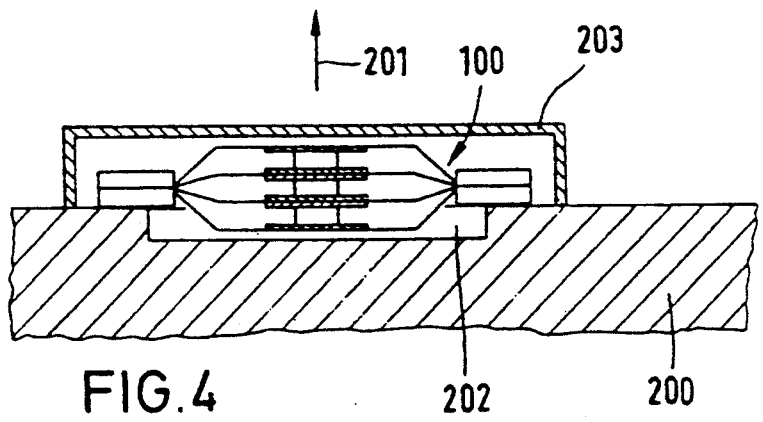
FIG. 4 is a sectional view showing the arrangement of the packaging of FIG. 3 in a projectile.

FIG. 4 shows a corresponding embodiment. Here, the reference numeral 200 identifies a projectile base which moves in the direction of arrow 201.

A recess 202 is provided in its base 200, with part of packaging 100 extending thereinto so that, under great accelerations, base 200 acts as a support surface. In the illustrated embodiment, packaging 100 is provided with a protective covering 203.

Thin sheets 1, 2; 101-104, should be made of a shock resistant, elastic material (e.g. polyimide) on which the conductor paths can be fastened or applied, respectively.

I claim:

1. An acceleration resistant packaging for integrated circuits wherein; the integrated circuits are each disposed between two thin sheets of a shock resistant, elastic material; connecting leads for the integrated circuits extend beyond the periphery of the thin sheets; and the two thin sheets are fastened to each other and are clamped in a clamping frame along their entire periphery to define a closed interior space containing the integrated circuits.

2. An acceleration resistant packaging according to claim 1, wherein the connecting leads include conductor paths applied to an interior surface of at least one of said thin sheets.

3. An acceleration resistant packaging according to claim 1, wherein the packaging is composed of at least three of said thin sheets which are all fastened in said clamping frame, and integrated circuits are arranged between each two adjacent of said thin sheets.

4. An acceleration resistant packaging according to claim 3, wherein said connecting leads include laminar circuits applied to sides of the thin sheets facing the integrated circuits and connected with the integrated circuits.

5. A method of producing acceleration resistant packagings according to claim 1, comprising:
applying the integrated circuits are to a first thin sheet;
connecting the integrated circuits with the connecting wires;
placing the second thin sheet onto the first thin sheet provided with the integrated circuits; and
clamping the first and second thin sheets about their entire periphery in a clamping frame.

6. A method according to claim 5, further comprising, before clamping the thin sheets in the clamping frame, fastening the first and second thin sheets together along their entire periphery, and carryout one of (a) evacuating the interior between the thin sheets and (b) filling the interior between the thin sheets with an inert gas.

7. A method according to claim 5, further comprising, before the step of applying the integrated circuits, providing the thin sheets are with laminar circuits with which the integrated circuits are connected.

8. An acceleration resistant packaging according to claim 1 wherein said interior space is evacuated.

9. An acceleration resistant packaging according to claim 1 wherein said interior space is filled with an inert gas.

10. An acceleration resistant packaging according to claim 1 wherein: said clamping frame comprises first and second frame-like clamping members; and the entire periphery of said two thin sheets is clamped between said first and second frame-like members.

11. An acceleration resistant packaging according to claim 1 wherein said thin sheets are formed of polyamide.

12. An acceleration resistance package for integrated circuits comprising: first and second overlying thin sheets of a shock resistant elastic material which are fastened together along their entire periphery to define an interior space; at least one integrated circuit disposed between said first and second sheets in said interior space and having connecting leads which extend beyond the periphery of said first and second thin sheets; and a clamping frame extending along the entire periphery of said first and second thin sheets for clamping said first and second sheets together.

13. An acceleration resistant package according to claim 12 wherein said first and second thin sheets contact one another along said periphery.

14. An acceleration resistant package according to claim 12 wherein said connecting leads include conductive films applied to an inner surface of one of said thin sheets.

15. An acceleration resistant package according to claim 12 wherein said interior space is evacuated.

16. An acceleration resistant package according to claim 13 wherein said interior space is filled with an inert gas.

17. An acceleration resistant package according to claim 12 wherein: said clamping frame comprises first and second frame-like members which are disposed on respective outer surfaces of said first and second sheets, which extend along the entire said periphery of said first and second sheets, and which are fastened to said first and second sheets.

18. An acceleration resistant package according to claim 12 wherein said at least one integrated circuit is mounted on an inner surface of one of said first and second sheets.

19. An acceleration resistant package according to claim 18 wherein said connecting leads comprise conductive films disposed on said inner surface of said one of said first and second sheets; and said at least one integrated circuit is mounted on and connected to said conductive films.

* * * * *